(12) United States Patent
Wang et al.

(10) Patent No.: US 7,548,064 B1
(45) Date of Patent: Jun. 16, 2009

(54) FOLDED GRADIENT TERMINAL BOARD END CONNECTOR

(75) Inventors: Wensen Wang, Clifton Park, NY (US); Bruce Courtney Campbell Amm, Clifton Park, NY (US); Weijun Yin, Niskayuna, NY (US); Yogen Vishwas Utturkar, Latham, NY (US); Tunc Icoz, Schenectady, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 12/006,118

(22) Filed: Dec. 29, 2007

(51) Int. Cl.
*G01V 3/00* (2006.01)
(52) U.S. Cl. ...................... 324/318; 324/309
(58) Field of Classification Search ......... 324/300–322; 600/407–435; 336/200, 192, 83, 65; 29/602
See application file for complete search history.

(56) References Cited

U.S. PATENT DOCUMENTS

| | | | | |
|---|---|---|---|---|
| 4,367,450 A * | 1/1983 | Carillo | ...................... | 336/200 |
| 4,571,663 A * | 2/1986 | McPherson | .................. | 361/735 |
| 4,873,757 A * | 10/1989 | Williams | .................... | 29/602.1 |
| 5,666,054 A * | 9/1997 | Westphal | .................... | 324/318 |
| 6,073,339 A * | 6/2000 | Levin | .......................... | 29/606 |
| 6,236,209 B1 * | 5/2001 | Arz et al. | .................... | 324/318 |
| 6,696,837 B2 * | 2/2004 | Konijn | ....................... | 324/318 |
| 6,870,457 B2 * | 3/2005 | Chen et al. | .................. | 336/200 |
| 7,365,542 B1 * | 4/2008 | Rohling et al. | .............. | 324/318 |
| 7,408,425 B2 * | 8/2008 | Zabinski et al. | ............... | 333/33 |
| 7,434,739 B2 * | 10/2008 | Matsuura et al. | ............ | 235/492 |
| 2004/0085067 A1 * | 5/2004 | Stocker | ...................... | 324/318 |

* cited by examiner

*Primary Examiner*—Brij B Shrivastav
(74) *Attorney, Agent, or Firm*—Jason K. Klindtworth

(57) ABSTRACT

A folded gradient terminal board end connector includes a multi-layer terminal connection board having a plurality of connection paths and vias configured to provide intercrossing between a plurality of folded gradient coils and further to provide symmetry between the plurality of folded gradient coils without spatial interference between folded portions of the plurality of folded gradient coils to optimize the folded gradient coil efficiency.

18 Claims, 2 Drawing Sheets

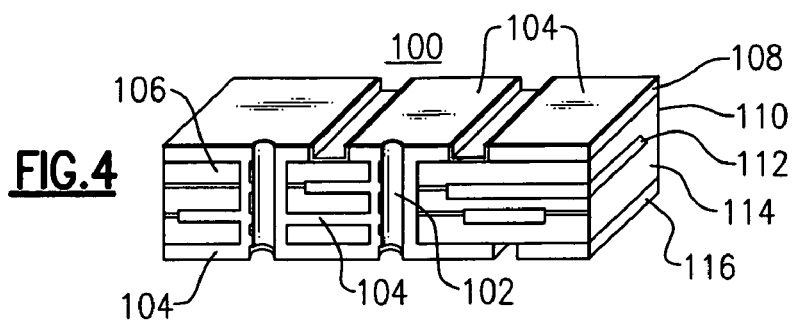
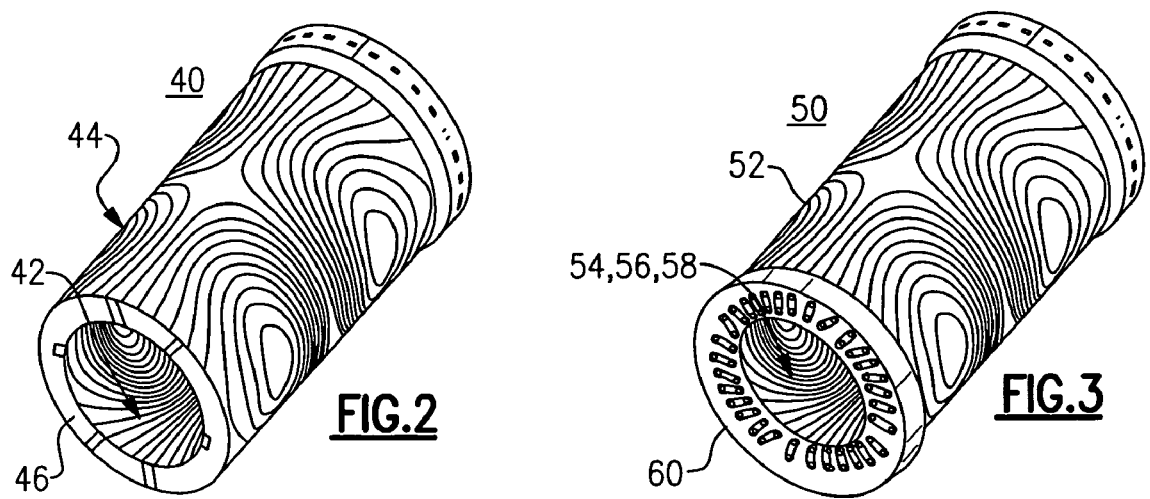
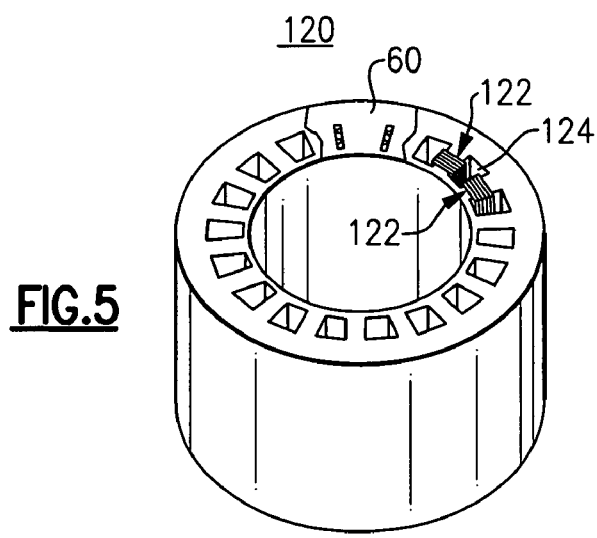

FOLDED GRADIENT TERMINAL BOARD END CONNECTOR

BACKGROUND

The invention relates generally to magnetic resonance imaging (MRI) systems. In particular, the invention relates to a terminal board end connector for the construction of a folded gradient coil in a MRI system.

The embodiments described here are particularly directed to the construction of a folded gradient coil in an MRI system. However, its application can be expanded to other areas in which there is a need for complicated leads or coil connections and which has a limited space to assemble them, such as an electric machine with a closed slot structure.

Magnetic Resonance Imaging (MRI) is a non-invasive method, based on the physical phenomenon of nuclear spin resonance to obtain the image of the inside of an object. It has been employed for many years in the past in the field of chemistry to identify the atomic constituents in the sample material. In the past 20 years, MRI has been successfully introduced into medical imaging to demonstrate pathological or other physiological alternations of living tissues. Now its medical and diagnostic applications appear to be numerous and significant.

During the imaging process of MRI, an object is exposed to a strong constant magnetic field. This aligns the nuclear spins of the atoms in the object, which were previously oriented irregularly. Radio-frequency waves can now excite these "ordered" nuclear spins to a specific oscillation (resonant frequency). In MRI, this oscillation generates the actual measuring signal (RF response signal), which is picked up by suitable receiving coils.

The foregoing medical imaging techniques are generally implemented via a magnetic resonance imaging (MRI) apparatus such as that shown in FIG. 1 that illustrates a structure of an MRI apparatus 10 that includes a magnetostatic field magnet unit 12, a gradient coil unit 13, an RF coil unit 14, an RF driver unit 22, a gradient coil driver unit 23, a data acquisition unit 24, a controller unit 25, a patient bed 26, a data processing unit 31, an operating console unit 32, and a display unit 33. The magnetic resonance imaging apparatus 10 transmits electromagnetic pulse signals to a subject 16 placed in an imaging space 18 with a magnetostatic field formed to perform a scan for obtaining magnetic resonance signals from the subject 16 to reconstruct an image of the slice of the subject 16 based on the magnetic resonance signals thus obtained by the scan.

The magnetostatic field magnet unit 12 includes, for example, typically an annular superconducting magnet, which is mounted within a toroidal vacuum vessel. The magnet defines a cylinder space surrounding the subject 16, and generates a constant primary magneto static field, along the Z direction of the cylinder space.

The magnetic resonance imaging (MRI) apparatus 10 also includes a gradient coil unit 13 that forms a gradient field in the imaging space 18 to add positional information to the magnetic resonance signals received by the FR coil unit 14. The gradient coil unit 13 includes three magnet systems, each of which generates a gradient magnetic field which inclines into one of three spatial axes perpendicular to each other, and generates a gradient field in each of frequency encoding direction, phase encoding direction, and slice selection direction in accordance with the imaging condition. More specifically, the gradient coil unit 13 applies a gradient field in the slice selection direction of the subject 16, to select the slice; and the RF coil unit 14 transmits an RF pulse to a selected slice of the subject 16 and excites it. The gradient coil unit 13 also applies a gradient field in the phase encoding direction of the subject 16 to phase encode the magnetic resonance signals from the slice excited by the RF pulse. The gradient coil unit 13 then applies a gradient field in the frequency encoding direction of the subject 16 to frequency encode the magnetic resonance signals from the slice excited by the RF pulse.

The gradient coil unit 13 can employ known gradient coil structures such as a conventional gradient coil that employs a separate primary coil portion and a separate shield coil portion. A conventional folded gradient coil such as the coil 40 depicted in FIG. 2 can also be employed to formulate the gradient coil unit 13. The folded gradient coil 40 has a primary coil portion 42 and a shield coil portion 44 that are connected via a folded portion 46 to provide a single gradient coil per axis. The folded coil structure advantageously provides for lower inductance, lower resistance, and a less leakage magnetic field as compared with the conventional structure that has two separated gradient coils.

The transverse folded gradient coils, X and Y necessarily have to intercross with one another to ensure symmetry and optimize coil efficiency. Ideally, the coil stack-up structure should be Y_shield, X_shield, Y_primary, X_primary. Manufacturing limitations such as spatial interferences associated with the folded part 46 of the coil prevent construction of such an ideal coil stack-up structure, resulting in a coil stack-up structure having a Y_shield, X_shield, X_primary, Y_primary sequence. The resultant stack-up structure causes non-symmetry, lowers the gradient coil efficiency, and creates a higher complexity of manufacturing requiring special parts to support the folded portion(s) 46 of the coil in which both the Y_shield and Y_primary coils lie on the cylinder surface.

A need therefore exists for a gradient coil structure that is easy to manufacture and that does not require special parts to support the folded portions of the gradient coil.

BRIEF DESCRIPTION

According to one embodiment, a folded gradient terminal board end connector comprises a multi-layer terminal connection board having a plurality of connection paths and vias configured to provide intercrossing between a plurality of folded gradient coils and further to provide symmetry between the plurality of folded gradient coils without spatial interference between folded portions of the plurality of folded gradient coils to optimize efficiency of a folded gradient coil assembly comprising the plurality of folded gradient coils.

According to another embodiment, a terminal board end connector comprises a multi-layer terminal connection board having a plurality of connection paths and vias configured to receive and interface a plurality of coil end leads to provide coupling symmetry between a plurality of coils and to optimize spatial and operating efficiency between the plurality of symmetrically coupled coils.

According to yet another embodiment, a method of connecting a plurality of folded gradient coils comprises:
  providing a folded gradient terminal board end connector having a plurality of connection paths and vias; and
  connecting a plurality of corresponding folded gradient coil end leads to the end connector to provide a folded gradient coil assembly having symmetry between a plurality of folded gradient coils without spatial interference between folded portions of the plurality of folded gradient coils to optimize coil efficiency of the plurality of folded gradient coils.

According to still another embodiment, a method of interconnecting a plurality of coils comprises:

providing a multi-layer terminal board end connector having a plurality of connection paths and vias configured to receive a plurality of coil end leads; and connecting the plurality of coil end leads to the end connector to provide coupling symmetry between a plurality of corresponding coils and to optimize spatial and operating efficiency between the plurality of symmetrically coupled coils.

DRAWINGS

These and other features, aspects, and advantages of the present invention will become better understood when the following detailed description is read with reference to the accompanying drawings in which like characters represent like parts throughout the drawings, wherein:

FIG. 2 is a pictorial diagram illustrating a conventional folded gradient coil structure known in the art;

FIG. 3 is a pictorial view illustrating a folded gradient coil structure, in accordance with one aspect of the present invention;

Figure 1:
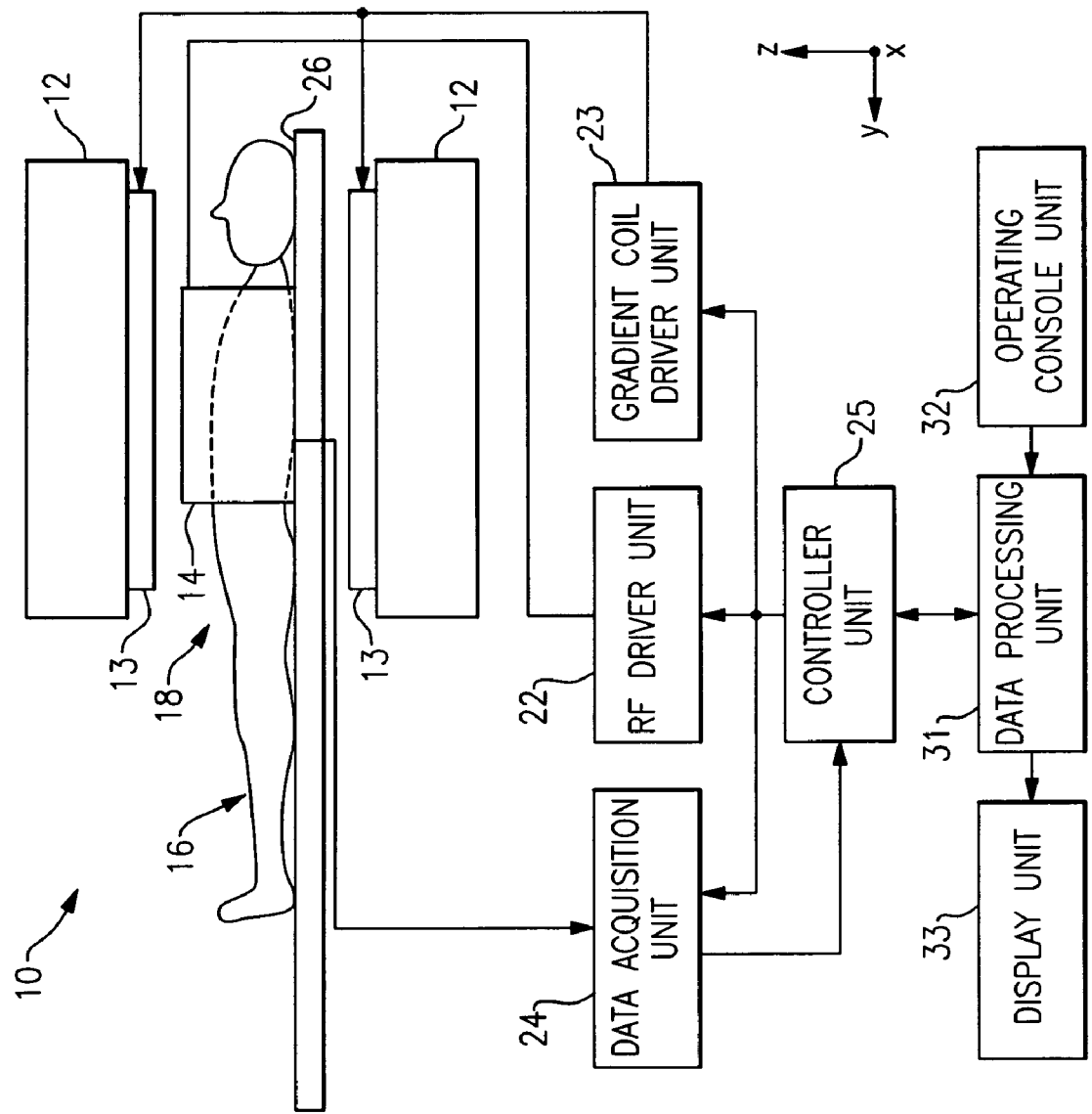
FIG. 1 is a magnetic resonance imaging apparatus known in the art.

FIG. 4 is a cross-sectional view of a portion of a folded gradient terminal board end connector suitable for use to implement the folded gradient coil structure depicted in FIG. 3, according to one aspect of the present invention; and FIG. 5 is a pictorial diagram illustrating a closed slot stator assembly suitable for use with a terminal board end connector, according to one aspect of the present invention.

While the above-identified drawing figures set forth alternative embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION

FIG. 3 is a pictorial diagram illustrating a folded gradient coil 50, in accordance with one aspect of the present invention. Folded gradient coil 50, according to one embodiment, includes an outer surface Y_shield coil 52 that surrounds an X_shield coil 54 that surrounds a Y_primary coil 56 that surrounds an X_primary coil 58 that lies on the inner surface of the gradient coil 50. A multi-layer terminal connection board 60 constructed in one embodiment of a laminated high thermal dielectric material is configured with connection paths and vias as described in further detail below with reference to FIG. 4. Wire leads from each portion of the folded gradient coil 50, i.e. Y_shield coil 52, X_shield coil 54, Y_primary coil 56, X_primary coil 58, are attached (soldered) to corresponding vias on the surface of the multi-layer terminal connection board 60. The requisite through channels on the multi-layer terminal connection board 60 are connected to predetermined vias by copper tracks in between the layers as well as on the surface of the terminal connection board 60.

The multi-layer terminal connection board 60 is constructed in a fashion such that intercrossing between the gradient coils 52, 54, 56, and 58 is accomplished to provide symmetry without spatial interference to optimize the gradient coil efficiency and reduce complexity of manufacturing.

FIG. 4 is a cross-sectional view of a portion 100 of the folded gradient terminal board end connector 60 suitable for use to implement the folded gradient coil structure 50 depicted in FIG. 3, according to one aspect of the present invention. Using this multilayer folded gradient terminal board connector 60, the leads from both the primary and shield portions of the folded gradient coil 50 can be soldered to the vias 102 which are on the outer surface of the board 60. Copper tracks 104 having a desired thickness are bounded to the high thermal dielectric material 106 using a thermal bonding procedure of prepreg that ensures the proper thermal conduction and insulation requirements are met.

The copper tracks 104 represent the wire patterns of the folded parts of the folded gradient coil structure 50. All of the wire leads will pass through the via 102 channels, crossing the different layers 108, 110, 112, 114, and 116 of the board connector 60. Each via 102 channel has an internal surface that is clad with a layer of copper foil. The copper foil, which has a certain thickness to handle the current up to about a couple of hundreds of amperes, provides a conductive path between the vias 102 and predetermined tracks 104 on different layers. In this way, two wire leads soldered on different vias 102 respectively, can be internally connected through the copper tracks 104 on the board connector 60.

Although all of the requisite gradient coil leads are soldered on the vias 102 of the multilayer folded gradient terminal board connector 60 using the same outer surface, the leads can thus have connections to different and distinct layers respectively. The primary and shield portions 52, 54, 56, and 58 of the two transverse folded gradient coils 50, in one embodiment, are soldered on one surface of the board connector 60 such that the board connector 60 becomes the folded part of the folded gradient coils 50, and such that the requisite connections are implemented in different board connector layers 108, 110, 112, 114, and 116.

The folded gradient coil structure 50 depicted in FIG. 3 and FIG. 4 substantially eliminates spatial interference generally associated with conventional gradient coil structures. Further, the folded gradient coil structure 50 allows use of well developed techniques associated with convention gradient coil manufacturing processes to manufacture the primary and shield coil parts separately, and then bond the individual parts together using the folded gradient terminal board end connector 60. The foregoing structure 50 advantageously provides a simpler solution for testing and troubleshooting manufacturing flaws due to the ease soldering and de-soldering the primary and shield coil parts to the folded gradient terminal board end connector 60.

Folded gradient coil 50 that includes folded gradient terminal board end connector 60 advantageously has a higher efficiency with less manufacturing complexity than conventional folded gradient coil assemblies known in the art. The folded gradient coil 50 that includes folded gradient terminal board end connector 60 further advantageously allows more folded gradient to be used in MRI systems such as MRI apparatus 10 depicted in FIG. 1. Further benefits include lower manufacturing costs, lower manufacturing risks, and lower maintenance costs. Another benefit associated with folded gradient coil 50 that includes folded gradient terminal board end connector 60 is an assembly having a lower inductance which translates into a lower cost on the corresponding gradient drive assembly and lower AC loss performance that now requires reduced cooling requirements and enhance image quality. The foregoing features allow use of higher speed image capture and larger patient bores in MRI systems.

The folded gradient terminal board end connector 60 is particularly advantageous when used to implement a folded gradient coil assembly, because the folded gradient terminal board end connector 60 allows construction of a cross sectional symmetric geometry for the folded gradient X and Y coils 50 due to elimination of spatial interference between the folded portions of the folded gradient X and Y coils 50.

The present invention is not so limited however, and those skilled in the art will readily appreciate the principles described herein above with reference to FIGS. 3-4 depicting particular embodiments, can just as easily be employed in many other applications such as, but not limited to, electric machine design and manufacturing. A closed slot in an electric motor/generator, for example, contributes to lower AC losses in the stator iron portion of the electric electric motor/generator. This feature is very important to a high speed machine having high efficiency requirements.

Typical stator winding schemes are not capable of providing a winding solution for such a closed slot stator structure such as that depicted in FIG. 5 however since such winding schemes employ a winding machine to wind a stator coil that subsequently needs to be inserted into the stator slot. The closed slot stator structure prevents insertion of the stator coil into the slot.

A terminal board end connector such as that described above allows a stator coil assembly 120 to be constructed for a closed-slot stator structure such as that illustrated in FIG. 5 that depicts a plurality of closed slots 124. A winding machine is used to wind the stator coils first and then insert them as a whole part into the stator slots for a regular open-slot stator structure. One does not have the access space necessary to insert a pre-wound coil for a closed-slot stator structure such as depicted in FIG. 5. One can first insert a desired number of conductor bars into the slot 124 to obtain a desired number of turns for a desired stator coil 122 by using a terminal board end connector 126. The ends of conductor bars in different slots 124 are then connected to form the conducting loop and achieve a desired final stator coil 122 winding structure by using the terminal end connector board 126. Terminal end connector board 126 thus allows use of a closed-slot stator structure to provide a highly efficient stator coil assembly 120 during manufacture of an electric motor/generator.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A folded gradient terminal board end connector comprising a multi-layer terminal connection board having a plurality of connection paths and vias configured to provide intercrossing between a plurality of folded gradient coils and further to provide symmetry between the plurality of folded gradient coils without spatial interference between folded portions of the plurality of folded gradient coils to optimize efficiency of a folded gradient coil assembly comprising the plurality of folded gradient coils.

2. The folded gradient terminal board end connector according to claim 1, wherein the symmetry between the plurality of folded gradient coils is provided by a folded gradient coil assembly outer surface Y-axis shield coil that surrounds an X-axis shield coil that surrounds a Y-axis primary coil that surrounds an X-axis primary coil that lies on the inner surface of the folded gradient coil assembly, 3. The folded gradient terminal board end connector according to claim 1, wherein the connection paths comprise copper tracks having a desired thickness, wherein the tracks are bounded to a high thermal dielectric material using a thermal bonding procedure of prepreg that provides a desired level of thermal conduction and insulation.

4. The folded gradient terminal board end connector according to claim 1, wherein the plurality of gradient coils are interfaced using solely the same outer surface of the board end connector such that the board end connector becomes the folded part of the folded gradient coil assembly.

5. The folded gradient terminal board end connector according to claim 1, wherein the folded gradient coil assembly is configured as a magnetic resonance imaging system gradient coil.

6. A terminal board end connector comprising a multi-layer terminal connection board having a plurality of connection paths and vias configured to receive and interface a plurality of coil end leads to provide coupling symmetry between a plurality of coils and to optimize spatial and operating efficiency between the plurality of symmetrically coup led coils, wherein the plurality of coils are together configured as a magnetic resonance imaging system gradient coil.

7. The terminal board end connector according to claim 6, wherein the connection paths comprise copper tracks having a desired thickness, and further wherein the tracks are bounded to a high thermal dielectric material using a lamination procedure that provides a desired level of thermal conduction and insulation.

8. The terminal board end connector according to claim 6, wherein the plurality of coils are interfaced using solely the same outer surface of the board end connector.

9. The terminal board end connector according to claim 6, wherein the plurality of coils are configured as closed slot electric machine stator coils.

10. A method of connecting a plurality of folded gradient coils comprises:
    providing a folded gradient terminal board end connector having a plurality of connection paths and vias; and
    connecting a plurality of corresponding folded gradient coil end leads to the end connector to provide a folded gradient coil assembly having symmetry between a plurality of folded gradient coils without spatial interference between folded portions of the plurality of folded gradient coils to optimize coil efficiency of the plurality of folded gradient coils.

11. The method according to claim 10, wherein providing a folded gradient terminal board end connector having a plurality of connection paths and vias comprises providing a folded gradient terminal board end connector including copper tracks having a desired thickness, wherein the tracks are bound to a high thermal dielectric material using a lamination procedure that provides a desired level of thermal conduction and insulation.

12. The method according to claim 10, wherein connecting a plurality of corresponding folded gradient coil end leads to the end connector to provide a folded gradient coil assembly having symmetry between a plurality of folded gradient coils without spatial interference between folded portions of the plurality of folded gradient coils to optimize coil efficiency of the plurality of folded gradient coils comprises connecting a plurality of corresponding folded gradient coil end leads to the end connector such that the symmetry between the plurality of folded gradient coils is provided by a folded gradient coil assembly outer surface Y-axis shield coil that surrounds an X-axis shield coil that surrounds a Y-axis primary coil that surrounds an X-axis primary coil that lies on the inner surface of the folded gradient coil assembly.

13. The method according to claim 10, wherein connecting a plurality of corresponding folded gradient coil end leads to the end connector to provide a folded gradient coil assembly having symmetry between a plurality of folded gradient coils without spatial interference between folded portions of the plurality of folded gradient coils to optimize coil efficiency of the plurality of folded gradient coils comprises connecting the plurality of corresponding folded gradient coil end leads solely to the same outer surface of the board end connector such that the board end connector becomes the folded part of the folded gradient coil assembly.

14. The method according to claim 10, wherein connecting a plurality of corresponding folded gradient coil end leads to the end connector to provide a folded gradient coil assembly comprises connecting a plurality of corresponding folded gradient coil end leads to the end connector to provide a magnetic resonance imaging system gradient coil.

15. A method of interconnecting a plurality of coils comprises:
providing a multi-layer terminal board end connector having a plurality of connection paths and vias configured to receive a plurality of coil end leads; and
connecting the plurality of coil end leads to the end connector to provide coupling symmetry between a plurality of corresponding coils and to optimize spatial and operating efficiency between the plurality of symmetrically coupled coils, wherein connecting the plurality of coil end leads to the end connector comprises connecting the plurality of coil end leads solely to the same outer surface of the board end connector to form a magnetic resonance imaging system gradient coil.

16. The method according to claim 15, wherein providing a multi-layer terminal board end connector having a plurality of connection paths and vias comprises providing a multi-layer terminal board end connector including copper tracks having a desired thickness, wherein the tracks are bound to a high thermal dielectric material using a lamination procedure that provides a desired level of thermal conduction and insulation.

17. The method according to claim 15, wherein connecting the plurality of coil end leads to the end connector comprises connecting the plurality of coil end leads solely to the same outer surface of the board end connector.

18. The method according to claim 15, wherein connecting the plurality of coil end leads to the end connector comprises connecting the plurality of coil end leads solely to the same outer surface of the board end connector to form a plurality of closed slot electric machine stator coils.

* * * * *